United States Patent
Tang et al.

(10) Patent No.: US 9,291,680 B2
(45) Date of Patent: Mar. 22, 2016

(54) CIRCUITS AND METHODS FOR MEASURING A CELL VOLTAGE IN A BATTERY

(75) Inventors: Xiaohu Tang, Shanghai (CN); Guoxing Li, Sunnyvale, CA (US)

(73) Assignee: O2Micro Inc., Santa Clara, CA (US)

( * ) Notice: Subject to any disclaimer, the term of this patent is extended or adjusted under 35 U.S.C. 154(b) by 758 days.

(21) Appl. No.: 13/586,581

(22) Filed: Aug. 15, 2012

(65) Prior Publication Data

US 2013/0214789 A1 Aug. 22, 2013

Related U.S. Application Data

(63) Continuation-in-part of application No. 13/207,255, filed on Aug. 10, 2011, now abandoned, and a continuation-in-part of application No. 12/955,604, filed on Nov. 29, 2010, now Pat. No. 8,629,679.

(60) Provisional application No. 61/290,563, filed on Dec. 29, 2009.

(51) Int. Cl.
| | |
|---|---|
| G01R 31/36 | (2006.01) |
| G01R 31/02 | (2006.01) |
| H01M 6/50 | (2006.01) |

(52) U.S. Cl.
CPC .......... *G01R 31/3644* (2013.01); *G01R 31/026* (2013.01); *G01R 31/3606* (2013.01); *G01R 31/3658* (2013.01); *H01M 6/5044* (2013.01)

(58) Field of Classification Search
USPC ............................................ 324/431; 702/63
See application file for complete search history.

(56) References Cited

U.S. PATENT DOCUMENTS

| | | | | |
|---|---|---|---|---|
| 6,002,237 | A * | 12/1999 | Gaza ............................ | 320/116 |
| 6,114,838 | A * | 9/2000 | Brink et al. .................. | 320/136 |
| 6,919,706 | B2 | 7/2005 | Furukawa | |
| 7,352,155 | B2 | 4/2008 | Li et al. | |
| 7,417,405 | B2 | 8/2008 | Carrier et al. | |
| 7,417,438 | B2 | 8/2008 | Miyamoto | |
| 7,501,794 | B2 * | 3/2009 | Felder et al. ................. | 320/128 |
| 7,602,144 | B2 | 10/2009 | Seo | |
| 7,965,061 | B2 | 6/2011 | Li et al. | |
| 7,999,554 | B2 | 8/2011 | Bucur et al. | |
| 8,030,973 | B2 | 10/2011 | Li et al. | |
| 8,049,438 | B2 | 11/2011 | Liu et al. | |
| 8,258,792 | B2 | 9/2012 | Vandensande | |
| 2002/0010558 | A1 | 1/2002 | Bertness et al. | |
| 2002/0193955 | A1 | 12/2002 | Bertness et al. | |

(Continued)

FOREIGN PATENT DOCUMENTS

| | | |
|---|---|---|
| CN | 2426242 Y | 4/2001 |
| CN | 1473371 A | 2/2004 |

(Continued)

*Primary Examiner* — Paul D Lee (57) ABSTRACT

A circuit measures a cell voltage of a cell in a battery. The circuit includes a measurement circuit and a current generator. The measurement circuit includes a first terminal coupled to a positive terminal of a cell via a first resistive element and includes a second terminal coupled to a negative terminal of the cell via a second resistive element. The measurement circuit consumes a first current. The current generator generates a first compensation current according to the first current. The first current and the first compensation current flow from the positive terminal through the first resistive element to the first terminal. The measurement circuit calculates the cell voltage according to a first voltage difference between the first and second terminals when the first compensation current is disabled and according to a second voltage difference between the first and second terminals when the first compensation current is enabled.

20 Claims, 10 Drawing Sheets

(56) References Cited

U.S. PATENT DOCUMENTS

| | | |
|---|---|---|
| 2003/0232237 A1 | 12/2003 | Nakagawa et al. |
| 2004/0051534 A1 | 3/2004 | Kobayashi et al. |
| 2004/0158418 A1* | 8/2004 | Kato et al. .................. 702/63 |
| 2008/0088277 A1 | 4/2008 | Wang et al. |
| 2010/0070220 A1* | 3/2010 | Darilek .................. 702/63 |
| 2010/0157495 A1 | 6/2010 | Densham |
| 2010/0188046 A1 | 7/2010 | Liu et al. |

FOREIGN PATENT DOCUMENTS

| | | |
|---|---|---|
| CN | 2914448 Y | 6/2007 |
| CN | 100463435 C | 2/2009 |
| CN | 101499671 A | 8/2009 |
| CN | 101888101 A | 11/2010 |
| CN | 102109579 A | 6/2011 |
| JP | 2007256218 A | 10/2007 |
| JP | 2009159769 A | 7/2009 |
| JP | 4340514 B2 | 10/2009 |
| TW | 200627746 A | 8/2006 |
| TW | 200822484 A | 5/2008 |
| TW | 200828725 A | 7/2008 |
| TW | 200919900 A | 5/2009 |
| TW | 201010507 A | 3/2010 |
| WO | 2006055661 A2 | 5/2006 |

* cited by examiner

CIRCUITS AND METHODS FOR MEASURING A CELL VOLTAGE IN A BATTERY

RELATED APPLICATION

This application is a continuation-in-part of U.S. patent application Ser. No. 13/207,255, filed Aug. 10, 2011, which is hereby incorporated by reference in its entirety. This application is also a continuation-in-part of U.S. patent application Ser. No. 12/955,604, filed Nov. 29, 2010, which claims priority to U.S. Provisional Application Ser. No. 61/290,563, filed on Dec. 29, 2009, both of which are also hereby incorporated by reference in its entirety.

BACKGROUND

Figure 1:
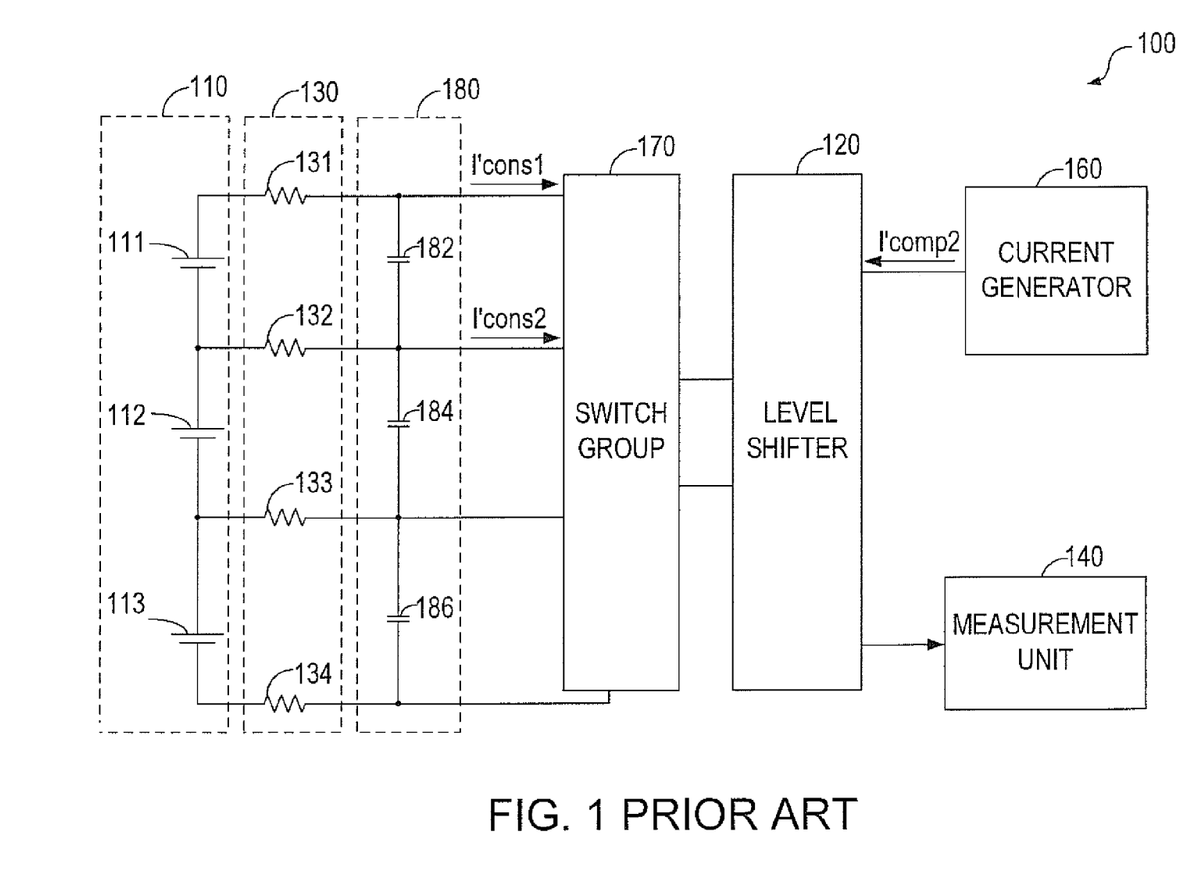
FIG. 1 illustrates a conventional circuit for measuring a cell voltage of a cell in a battery.

FIG. 1 shows a conventional circuit 100 for measuring a cell voltage of a cell in a battery. The circuit 100 includes a battery 110, a level shifter 120, a resistor group 130, a capacitor group 180, a measurement unit 140, a current generator 160, and a switch group 170. In the example of FIG. 1, the battery 110 includes cells 111-113 coupled in series. The resistor group 130 includes resistors 131-134. The capacitor group 180 includes capacitors 182, 184 and 186. The resistor group 130 and the capacitor group 180 filter noises of signals transmitted between the battery 110 and the switch group 170. The switch group 170 selects a cell from the cells 111-113. The level shifter 120 provides a shifted voltage proportional to the cell voltage of the selected cell. The measurement unit 140 calculates the cell voltage of the selected cell according to the shifted voltage generated by the level shifter 120.

The level shifter 120 consumes currents from the battery 110. By way of example, when the cell 111 is selected, the level shifter 120 consumes a current $I'_{cons1}$ flowing from the positive terminal of the cell 111, through the resistor 131 and the switch group 170, and to the level shifter 120. The level shifter 120 also consumes a current $I'_{cons2}$ flowing from the negative terminal of the cell 111, through the resistor 132 and the switch group 170, and to the level shifter 120. The voltage drops across the resistors 131 and 132 adversely affect the accuracy of the cell voltage measurement. To reduce such impact, the current generator 160 generates a compensation current $I'_{comp2}$ flowing through the level shifter 120, the switch group 170 and the resistor 132 and to the negative terminal of the cell 111. Thus, if the compensation current $I'_{comp2}$ is substantially equal to the current $I'_{cons2}$, the voltage drop across the resistor 132 can be ignored.

However, a difference between the positive terminal voltage of the cell 111 and the supply voltage of the current generator 160 may not be large enough such that the current generator 160 may not be able to generate a current flowing into the positive terminal of the cell 111 to compensate the voltage drop across the resistor 131. Thus, the voltage drop across the resistor 131 still has an adverse effect on the accuracy of the cell voltage measurement.

SUMMARY

In one embodiment, a circuit measures a cell voltage of a cell in a battery. The circuit includes a measurement circuit and a current generator. The measurement circuit includes a first terminal coupled to a positive terminal of a cell via a first resistive element and includes a second terminal coupled to a negative terminal of the cell via a second resistive element. The measurement circuit further consumes a first current flowing from the positive terminal through the first resistive element to the first terminal and consumes a second current flowing from the negative terminal through the second resistive element to the second terminal. The current generator, coupled to the battery, generates a first compensation current according to the first current. The first compensation current flows from the positive terminal through the first resistive element to the first terminal. The measurement circuit receives a first voltage difference between the first terminal and the second terminal when the first compensation current is disabled, and receives a second voltage difference between the first terminal and the second terminal when the first compensation current is enabled. The measurement circuit further calculates the cell voltage according to the first voltage difference and the second voltage difference.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 2:
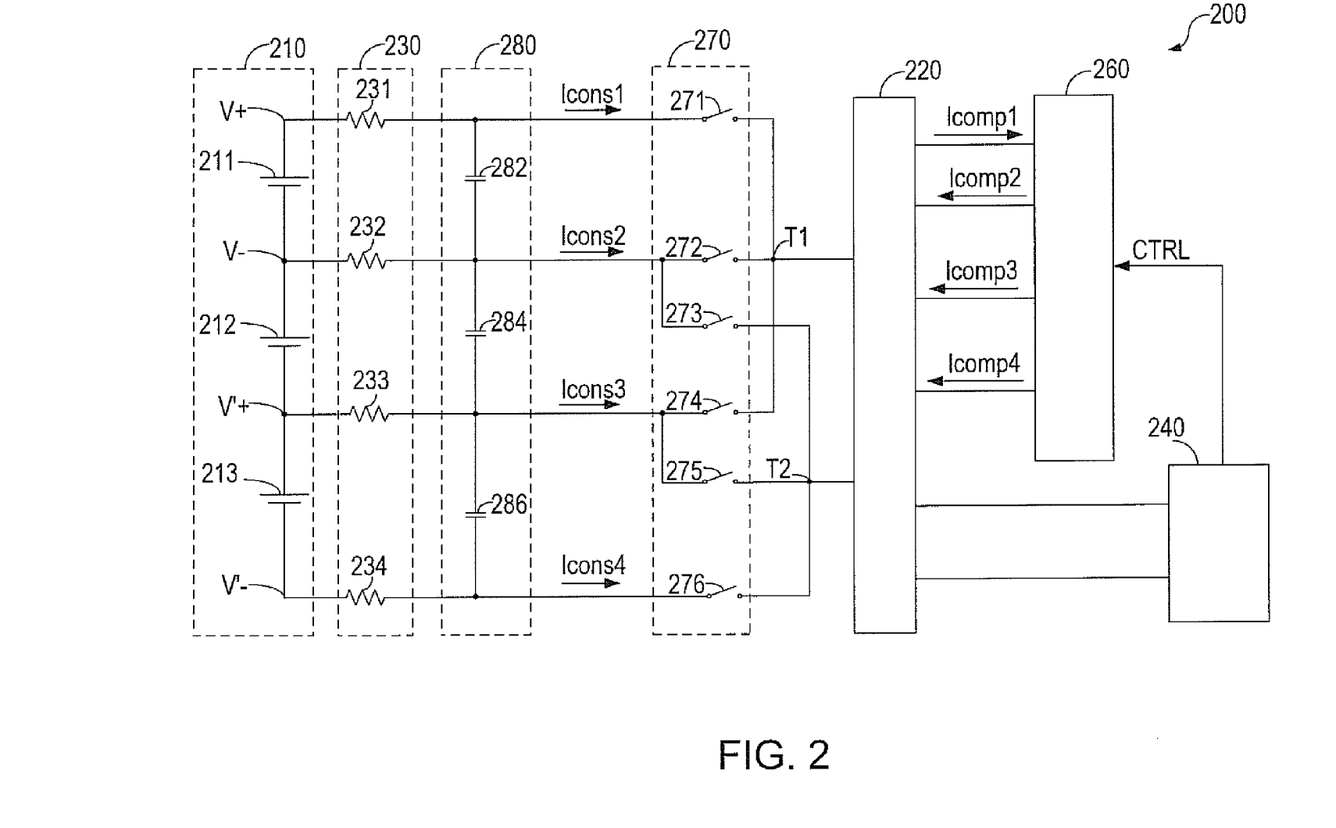
FIG. 2 illustrates an example of a circuit for measuring a cell voltage of a cell in a battery, in accordance with one embodiment of the present invention.

FIG. 2 illustrates an example of a circuit 200 for measuring a cell voltage of a cell in a battery, in accordance with one embodiment of the present invention. The circuit 200 includes a battery 210, a resistor group 230, a capacitor group 280, a switch group 270, a current generator 260, and a measurement circuit including a level shifter 220 and a measurement unit 240. In the example of FIG. 2, the battery 210 includes cells 211-213 coupled in series for illustration purposes. The battery 210 can include other number of cells. The resistor group 230 includes resistive elements such as resistors 231-234. The capacitor group 280 includes capacitors 282, 284 and 286. The resistor group 230 and the capacitor group 280 filter noises of signals transmitted between the battery 210 and the switch group 270.

The switch group 270 includes switches 271-276 for selecting a cell from the cells 211-213 to be measured by the measurement circuit. By selecting a cell, the switch group 270 provides a voltage difference between terminals T1 and T2, which indicates a cell voltage of the selected cell. For example, when the switches 271 and 273 are on and other switches in the switch group 270 are off, the cell 211 is selected. The switch group 270 provides a voltage difference between the terminals T1 and T2, which indicates a cell voltage of the selected cell 211.

The level shifter 220 receives a voltage difference between the terminals T1 and T2 and provides a shifted voltage difference proportional to the voltage difference between the terminals T1 and T2. The shifted voltage difference is provided to the measurement unit 240. The level shifter 220 consumes currents from the positive terminal and the negative terminal of the selected cell. By way of example, when the cell 211 is selected, the terminal T1 is coupled to the positive terminal V+ via the resistor 231 and the switch 271, and the terminal T2 is coupled to the negative terminal V− via the resistor 232 and the switch 273. The level shifter 220 consumes a current $I_{cons1}$ flowing from the positive terminal V+ through the resistor 231 and the switch 271 to the terminal T1, and consumes a current $I_{cons2}$ flowing from the negative terminal V− through the resistor 232 and the switch 273 to the terminal T2.

The current generator 260 generates compensation currents $I_{comp1}$ and $I_{comp2}$ according to the currents $I_{cons1}$ and $I_{cons2}$, respectively. The compensation current $I_{comp1}$ flows from the positive terminal V+ through the resistor 231 and the switch 271 to the terminal T1. The compensation current $I_{comp2}$ flows from the terminal T2 through the switch 273 and the resistor 232 to the negative terminal V−. In one embodiment, the compensation currents $I_{comp1}$ and $I_{comp2}$ are proportional to the currents $I_{cons1}$ and $I_{cons2}$, respectively.

The current generator 260 can disable or enable the compensation current $I_{comp1}$ according to a control signal CTRL from the measurement unit 240. Thus, the level shifter 220 receives a first voltage difference between the terminals T1 and T2 when the compensation current $I_{comp1}$ is disabled, and receives a second voltage difference between the terminals T1 and T2 when the compensation current $I_{comp1}$ is enabled. Accordingly, the level shifter 220 provides a first shifted voltage difference $V_{O1}$ indicative of the first voltage difference if the compensation current $I_{comp1}$ is disabled, and provides a second shifted voltage difference $V_{O2}$ indicative of the second voltage difference if the compensation current $I_{comp1}$ is enabled.

The measurement unit 240 measures the first shifted voltage difference $V_{O1}$ from the level shifter 220 when the compensation current $I_{comp1}$ is disabled, and measures the second shifted voltage difference $V_{O2}$ from the level shifter 220 when the compensation current $I_{comp1}$ is enabled. The measurement unit 240 calculates the cell voltage of the selected cell 211 according to the first shifted voltage difference $V_{O1}$ and the second shifted voltage difference $V_{O2}$. More specifically, in one embodiment, the measurement unit 240 calculates the cell voltage of the selected cell 211 by calculating a third voltage $V_{O3}$ proportional to the first shifted voltage difference $V_{O1}$, and subtracting the second shifted voltage difference $V_{O2}$ from the third voltage $V_{O3}$.

In operation, if the cell 211 is selected and the control signal CTRL has a first voltage level, e.g., logic low, the current generator 260 disables the compensation current $I_{comp1}$ and enables the compensation current $I_{comp2}$. Thus, a first voltage drop $V_{DROP1}$ is generated across the resistor 231. In one embodiment, the compensation current $I_{comp2}$ is substantially equal to the current $I_{cons2}$ consumed by the level shifter 220. Thus, the compensation current $I_{comp2}$ and the current $I_{cons2}$ cancel each other out, and the voltage drop across the resistor 232 can be ignored. The level shifter 220 receives a first voltage difference $V_{DIFF1}$ between the terminals T1 and T2. The relationship between the cell voltage $V_{CELL}$ of the cell 211 and the first voltage difference $V_{DIFF1}$ can be given by:

$$V_{DIFF1} = V_{CELL} - V_{DROP1}. \quad (1)$$

If the cell 211 is selected and the control signal CTRL has a second voltage level, e.g., logic high, the current generator 260 enables both the compensation currents $I_{comp1}$ and $I_{comp2}$. Thus, a second voltage drop $V_{DROP2}$ is generated across the resistor 231. In one embodiment, the compensation current $I_{comp1}$ is proportional to the current $I_{cons1}$ consumed by the level shifter 220. Thus, the relationship between the first voltage drop $V_{DROP1}$ and the second voltage drop $V_{DROP2}$ can be given by:

$$V_{DROP2} L \times V_{DROP1}, \quad (2)$$

where L is a constant indicating a proportional coefficient between the first voltage drop $V_{DROP1}$ and the second voltage drop $V_{DROP2}$, and is substantially equal to $(I_{cons1} + I_{comp1})/I_{cons1}$. The level shifter 220 receives a second voltage difference $V_{DIFF2}$ between the terminals T1 and T2. Assuming that the voltage drop across the resistor 232 can be ignored, the relationship between the cell voltage $V_{CELL}$ and the second voltage difference $V_{DIFF2}$ can be given by:

$$V_{DIFF2} = V_{CELL} - V_{DROP2} = V_{CELL} - L \times V_{DROP1}. \quad (3)$$

The level shifter 220 receives the first voltage difference $V_{DIFF1}$ and the second voltage difference $V_{DIFF2}$, and outputs the first shifted voltage difference $V_{O1}$ and the second shifted voltage difference $V_{O2}$, respectively. The measurement unit 240 can measure the first and second voltage differences $V_{DIFF1}$ and $V_{DIFF2}$ by measuring the first and second shifted voltage differences $V_{O1}$ and $V_{O2}$, and can calculate the cell voltage $V_{CELL}$ according to the first and second shifted voltage differences $V_{O1}$ and $V_{O2}$. In one embodiment, the relationship between $V_{O1}$ and $V_{DIFF1}$ and the relationship between $V_{O2}$ and $V_{DIFF2}$ are given by:

$$V_{O1} = K \times V_{DIFF1} = K \times (V_{CELL} - V_{DROP1}), \quad (4)$$

$$V_{O2} = K \times V_{DIFF2} = K \times (V_{CELL} - L \times V_{DROP1}), \quad (5)$$

where K is a constant indicating a proportional coefficient between the first shifted voltage difference $V_{O1}$ and the first voltage difference $V_{DIFF1}$, and is also a constant indicating a proportional coefficient between the second shifted voltage difference $V_{O2}$ and the second voltage difference $V_{DIFF2}$. The measurement unit 240 calculates a third voltage $V_{O3}$ proportional to the first shifted voltage difference $V_{O1}$, which is given by:

$$V_{O3}=L\times V_{O1}=L\times K\times V_{CELL}-L\times K\times V_{DROP1}. \quad (6)$$

By subtracting the second shifted voltage difference $V_{O2}$ from the third voltage $V_{O3}$, the measurement unit 240 can calculate the cell voltage $V_{CELL}$, which is given by:

$$V_{CELL}=(V_{O3}-V_{O2})/(L\times K-K). \quad (7)$$

Accordingly, the measurement circuit receives the first voltage difference $V_{DIFF1}$ between the terminal T1 and the terminal T2 when the compensation current $I_{comp1}$ is disabled, and receives a second voltage difference $V_{DIFF2}$ between the terminal T1 and the terminal T2 when the compensation current $I_{comp1}$ is enabled. The measurement circuit can calculate the cell voltage $V_{CELL}$ of the cell 211 according to the first and second voltage differences $V_{DIFF1}$ and $V_{DIFF2}$ and a proportion of the second voltage drop $V_{DROP2}$ to the first voltage drop $V_{DROP1}$.

Advantageously, by generating the compensation current $I_{comp1}$ flowing from the positive terminal V+ through the resistor 231 and measuring the voltage differences between the terminals T1 and T2 when the compensation current $I_{comp1}$ is enabled and disabled, respectively, the negative impact on the accuracy of the cell voltage measurement caused by the voltage drop $V_{DROP1}$ on the resistor 231 is reduced or eliminated.

The circuit 200 measures the cell voltages for the cells 212 and 213 in a similar manner. For example, when the cell 213 is selected, the level shifter 220 consumes a current $I_{cons3}$ flowing from the positive terminal V'+ of the cell 213 through the resistor 233 and the switch 274 to the terminal T1. Additionally, the level shifter 220 consumes a current $I_{cons4}$ flowing from the negative terminal V'− of the cell 213 through the resistor 234 and the switch 276 to the terminal T2. The current generator 260 generates compensation currents $I_{comp3}$ and $I_{comp4}$ according to the currents $I_{cons3}$ and $I_{cons4}$, respectively. The compensation current $I_{comp3}$ flows from the terminal T1 through the switch 274 and the resistor 233 to the positive terminal V'+. The compensation current $I_{comp4}$ flows from the terminal T2 through the switch 276 and the resistor 234 to the negative terminal V'−. In one embodiment, the compensation currents $I_{comp3}$ and $I_{comp4}$ are substantially equal to the currents $I_{cons3}$ and $I_{cons4}$, respectively. The measurement unit 240 measures the shifted voltage difference generated by the level shifter 220. The shifted voltage difference is proportional to the cell voltage of the cell 213. Accordingly, the circuit 200 obtains the cell voltage of the cell 213.

Figure 3:
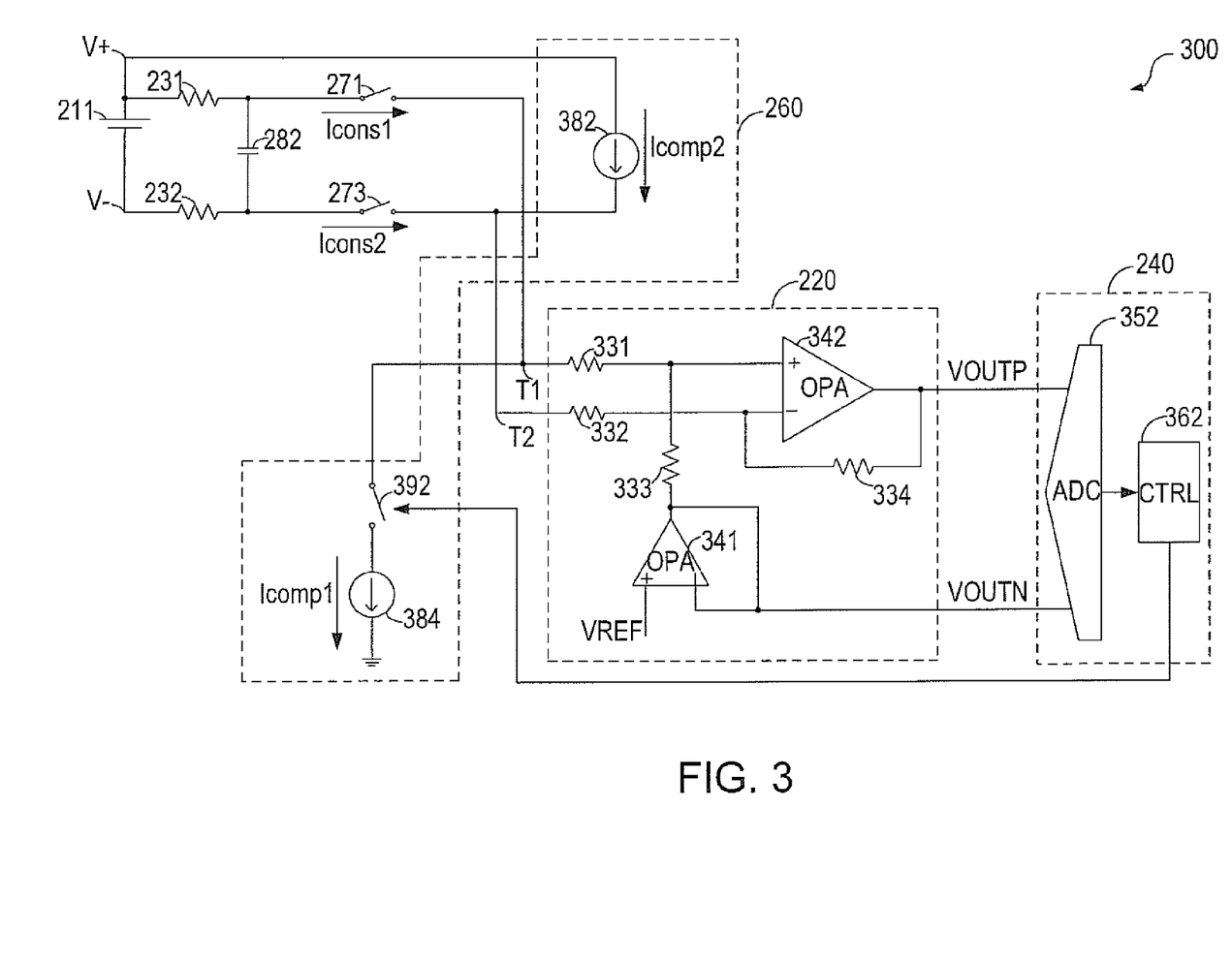
FIG. 3 illustrates an example of a circuit for measuring a cell voltage of a cell in a battery, in accordance with one embodiment of the present invention.

FIG. 3 illustrates an example of a circuit 300 for measuring a cell voltage of a cell in a battery, in accordance with one embodiment of the present invention. FIG. 3 is described in combination with FIG. 2. For illustrative purposes, the circuit 300 in FIG. 3 measures the cell voltage of the cell 211. Other cells in the battery 210 in FIG. 2 can be measured in a similar manner.

In the example of FIG. 3, the level shifter 220 includes amplifiers 341 and 342, and resistors 331, 332, 333 and 334. The current generator 260 includes current sources 382 and 384 for generating the compensation currents $I_{comp1}$ and $I_{comp2}$, respectively. The current generator 260 also includes a switch 392 coupled to the current source 384 in series to enable or disable the compensation current $I_{comp1}$. The measurement unit 240 includes an analog-to-digital converter (ADC) 352 and a control circuit 362. The ADC 352 converts the first and second shifted voltage differences $V_{O1}$ and $V_{O2}$ between shifted terminal voltages $V_{OUTP}$ and $V_{OUTN}$ to digital signals. The control circuit 362 controls the switch 392 in the current generator 260 to enable or disable the compensation current $I_{comp1}$. The control circuit 362 calculates the cell voltage $V_{CELL}$ according to the digital signals received from the ADC 352, which indicate the first and second shifted voltage differences $V_{O1}$ and $V_{O2}$.

In operation, when the switches 271 and 273 are on, the cell 211 is selected. The level shifter 220 consumes a current $I_{cons1}$ flowing from the terminal V+, through the resistor 231, the switch 271, the resistors 331 and 333, and the amplifier 341. Additionally, the level shifter 220 consumes a current $I_{cons2}$ flowing from the terminal V−, through the resistor 232, the switch 273, the resistors 332 and 334, and the amplifier 342.

The control circuit 362 turns the switch 392 off. Thus, the compensation current $I_{comp1}$ is disabled. The compensation current $I_{comp2}$ is enabled. In one embodiment, the compensation current $I_{comp2}$ is substantially equal to the current $I_{cons2}$ consumed by the level shifter 220.

The amplifier 341 receives a predetermined reference voltage $V_{REF}$. In one embodiment, the resistors 331 and 332 are identical, and the resistors 333 and 334 are identical. A voltage difference between the shifted terminal voltages $V_{OUTP}$ and $V_{OUTN}$ can be given by:

$$V_{OUTP}-V_{OUTN}=K\times(V_{T1}-V_{T2}), \quad (8)$$

where the constant K is given by:

$$K=R_{333}/R_{331}, \quad (9)$$

where $R_{333}$ is the resistance of the resistor 333, and $R_{331}$ is the resistance of the resistor 331.

Accordingly, the level shifter 220 provides the first shifted voltage difference $V_{O1}$ to the ADC 352. The ADC 352 converts the first shifted voltage difference $V_{O1}$ to a first digital signal D1.

The control circuit 362 then turns the switch 392 on. Thus, both the compensation currents $I_{comp1}$ and $I_{comp2}$ are enabled. Accordingly, the level shifter 220 provides the second shifted voltage difference $V_{O2}$ to the ADC 352. The ADC 352 converts the second shifted voltage difference $V_{O2}$ to a second digital signal D2. The control circuit 362 receives the first and second digital signals D1 and D2, and calculates the cell voltage $V_{CELL}$ accordingly.

Figure 4:
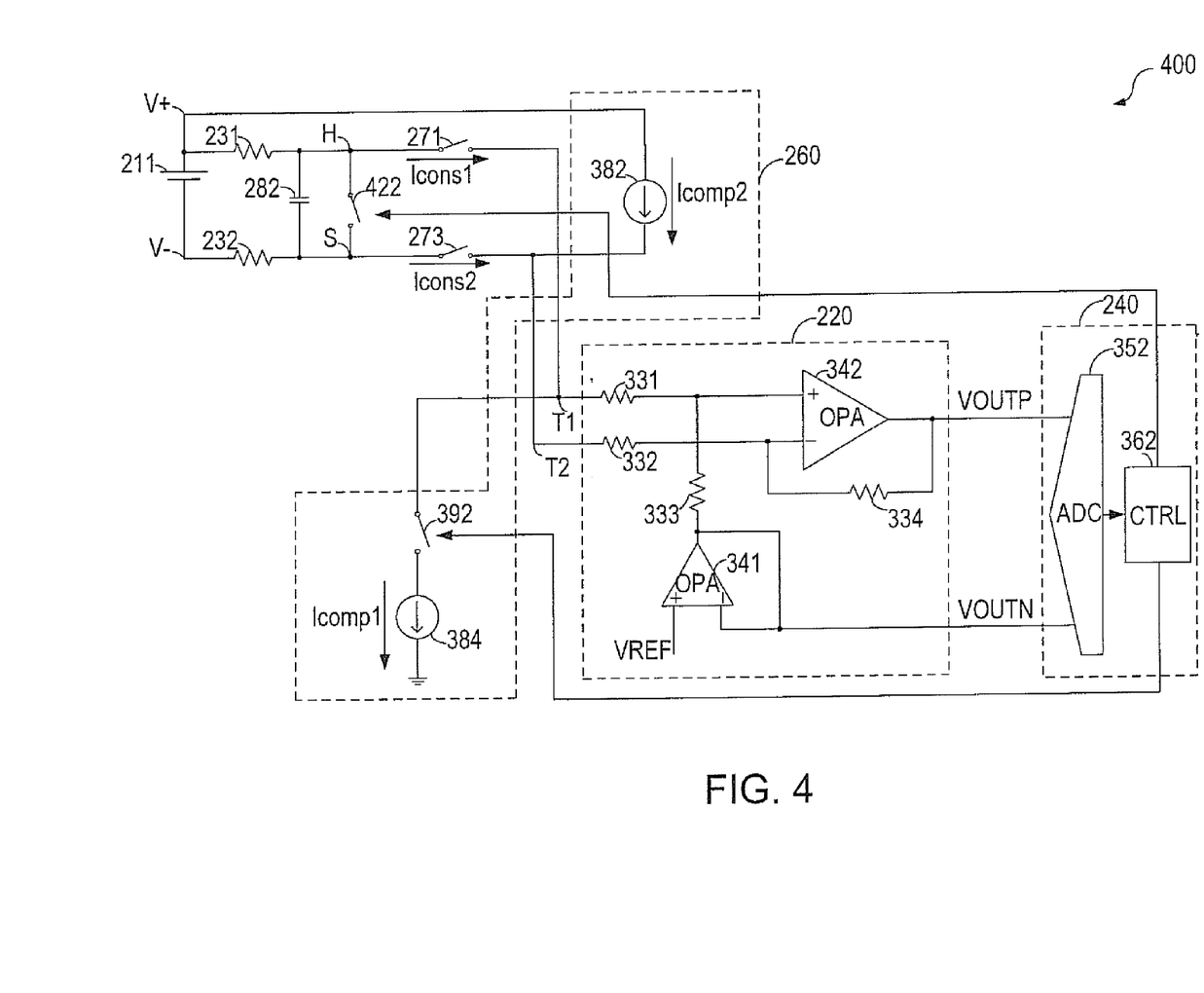
FIG. 4 illustrates an example of a circuit for measuring a cell voltage of a cell in a battery, in accordance with another embodiment of the present invention.

FIG. 4 illustrates an example of a circuit 400 for measuring a cell voltage of a cell in a battery, in accordance with another embodiment of the present invention. FIG. 4 is described in combination with FIG. 5 and FIG. 6.

In the example of FIG. 4, the level shifter 220 further includes a switch 422. By controlling the switch 422 during the process of measuring the cell voltage $V_{CELL}$, the impact of nonideal factors of the circuitry components on the cell voltage measurement can be reduced. For example, the nonideal factors includes the on-resistance of the switches 271 and 273, the mismatch between the resistor 331 and the resistor 332, the mismatch between the resistor 333 and the resistor 334, and the input offset voltage of the amplifier 342.

More specifically, the control circuit 362 turns the switch 422 on and off alternately. When the switch 422 is on, the measurement unit 240 measures the nonideal factors of the switches 271 and 273 and the level shifter 220, and obtains a measurement result $V_A$ accordingly. When the switch 422 is off, the level shifter 220 receives a voltage difference between the terminals T1 and T2, and the measurement unit 240 obtains a measurement result $V_B$ accordingly. Advantageously, by subtracting the measurement result $V_A$ from the measurement result $V_B$, the impact of the nonideal factors on the cell voltage measurement is reduced.

Figure 5:
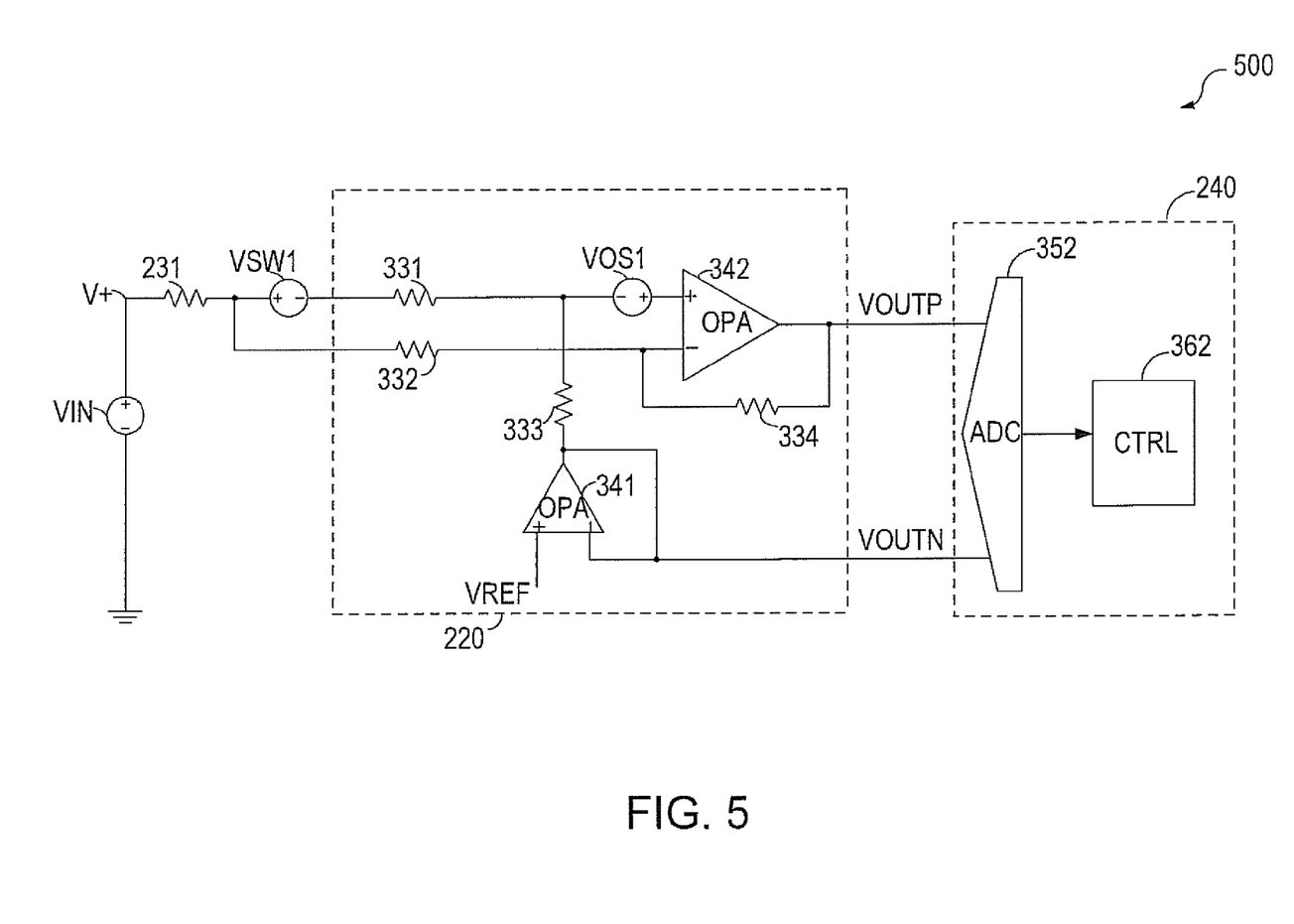
FIG. 5 illustrates an equivalent circuit of a circuit in FIG. 4, in accordance with one embodiment of the present invention.

In operation, the switches 271 and 273 are turned on to select the cell 211. The control circuit 362 turns the switch 422 on and the switch 392 off. Thus, the compensation current $I_{comp1}$ is disabled. The compensation current $I_{comp2}$ is enabled. Assuming that the compensation current $I_{comp2}$ is substantially equal to the current $I_{cons2}$ consumed by the level shifter 220, the voltage drop across the switch 273 can be ignored. Moreover, assuming that the voltage drop across the switch 271 is $V_{SW1}$ and the input offset voltage of the amplifier 342 is $V_{OS1}$, FIG. 5 shows an equivalent circuit 500 when the switch 422 is on and the switch 392 is off. The ADC 352 obtains a measurement result $V_{O1A}$ by measuring the voltage difference $V_{OUTP} - V_{OUTN}$. The measurement result $V_{O1A}$ is given by:

$$V_{O1A} = m_1 \times V_{SW1} + n_1 \times V_{OS1} + q_1 \times \Delta R \times V_{IN}, \quad (10)$$

where $m_1$, $n_1$, and $q_1$ are proportional coefficients, $\Delta R$ is the difference between a ratio $R_{331}/R_{333}$ and a ratio $R_{332}/R_{334}$, caused by the mismatch between the resistor 331 and the resistor 332 and the mismatch between the resistor 333 and the resistor 334, and $V_{IN}$ is the voltage at the positive terminal V+. In one embodiment, the measurement result $V_{O1A}$ indicates the nonideal factors of the on-resistance of the switch 271 and the input offset voltage of the amplifier 342 when the compensation current $I_{comp1}$ is disabled and the compensation current $I_{comp2}$ is enabled.

Figure 6:
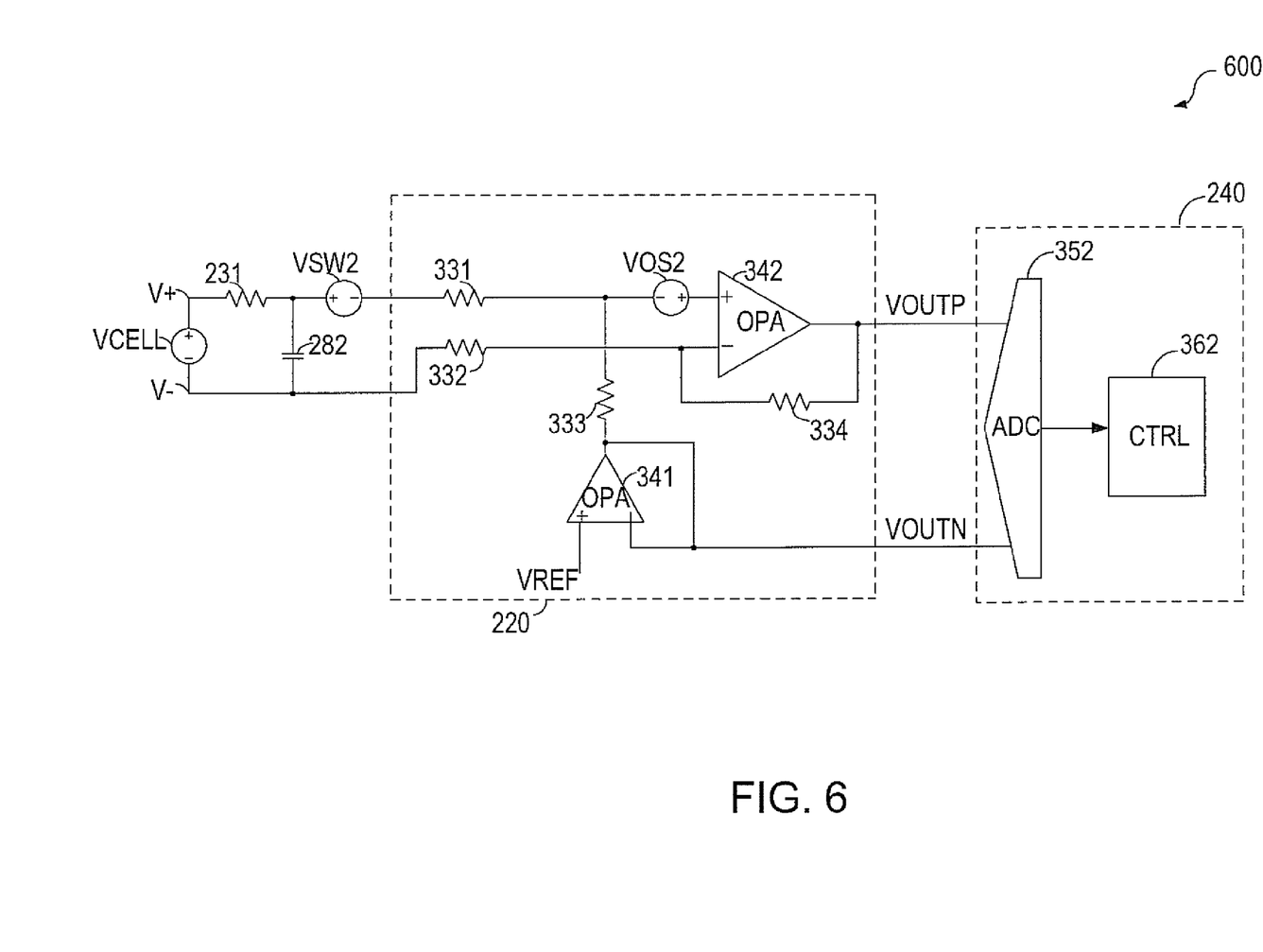
FIG. 6 illustrates another equivalent circuit of a circuit in FIG. 4, in accordance with one embodiment of the present invention.

Then, the control circuit 362 turns the switch 422 off and maintains the switch 392 off. FIG. 6 shows an equivalent circuit 600 when the switch 422 is off and the switch 392 is off. The ADC 352 obtains a measurement result $V_{O1B}$ by measuring the voltage difference $V_{OUTP} - V_{OUTN}$. The measurement result $V_{O1B}$ is given by:

$$V_{O1B} = V_{O1} + m_1 \times V_{SW1} + n_1 \times V_{OS1} + q_1 \times \Delta R \times V_{IN}. \quad (11)$$

In one embodiment, the measurement result $V_{O1B}$ indicates the first shifted voltage difference $V_{O1}$ and the nonideal factors of the on-resistance of the switch 271 and the input offset voltage of the amplifier 342 when the compensation current $I_{comp1}$ is disabled and the compensation current $I_{comp2}$ is enabled. Accordingly, the control circuit 362 obtains the first shifted voltage difference $V_{O1}$ by subtracting the measurement result $V_{O1A}$ from the measurement result $V_{O1B}$, thereby canceling the effect of the on-resistance of the switch 271 and the input offset voltage of the amplifier 342 on the cell voltage measurement.

The control circuit 362 then turns both the switches 422 and 392 on. Thus, the compensation currents $I_{comp1}$ and $I_{comp2}$ are enabled. Similarly, assuming that the voltage drop across the switch 273 is ignored, the voltage drop across the switch 271 is $V_{SW2}$, and the input offset voltage of the amplifier 342 is $V_{OS2}$, the equivalent circuit when the switches 422 and 392 are on is similar to the circuit 500 in FIG. 5. In one embodiment, the input offset voltage $V_{OS1}$ is identical to the input offset voltage $V_{OS2}$. The ADC 352 obtains a measurement result $V_{O2A}$ by measuring the voltage difference $V_{OUTP} - V_{OUTN}$. The measurement result $V_{O2A}$ is given by:

$$V_{O2A} = m_2 \times V_{SW2} + n_2 \times V_{OS2} + q_2 \times \Delta R \times V_{IN}, \quad (12)$$

where $m_2$, $n_2$, and $q_2$ are proportional coefficients. In one embodiment, the measurement result $V_{O2A}$ indicates the nonideal factors of the on-resistance of the switch 271 and the input offset voltage of the amplifier 342 when the compensation currents $I_{comp1}$ and $I_{comp2}$ are enabled.

Then, the control circuit 362 turns the switch 422 off and maintains the switch 392 on. The equivalent circuit when the switch 422 is off and the switch 392 is on is similar to the circuit 600 in FIG. 6. Likewise, The ADC 352 obtains a measurement result $V_{O2B}$ by measuring the voltage difference $V_{OUTP} - V_{OUTN}$. The measurement result $V_{O2B}$ is given by:

$$V_{O2B} = V_{O2} + m_2 \times V_{SW2} + n_2 \times V_{OS2} + q_2 \times \Delta R \times V_{IN}. \quad (13)$$

In one embodiment, the measurement result $V_{O2B}$ indicates the second shifted voltage difference $V_{O2}$ and the nonideal factors of the on-resistance of the switch 271 and the input offset voltage of the amplifier 342 when the compensation currents $I_{comp1}$ and $I_{comp2}$ are enabled. Accordingly, the control circuit 362 obtains the second shifted voltage difference $V_{O2}$ by subtracting the measurement result $V_{O2A}$ from the measurement result $V_{O2B}$, thereby canceling the effect of the on-resistance of the switch 271 and the input offset voltage of the amplifier 342 on the cell voltage measurement.

The control circuit 362 calculates the cell voltage $V_{CELL}$ based on the first and second shifted voltage differences $V_{O1}$ and $V_{O2}$. In the example of FIG. 4, the switch 422 is placed between the terminals H and S. Alternatively, the switch 422 can be placed between the terminals T1 and T2, achieving similar result. Advantageously, by reducing the impact of the nonideal factors on the cell voltage measurement, the circuit 400 can measure the cell voltage $V_{CELL}$ more accurately.

Figure 7:
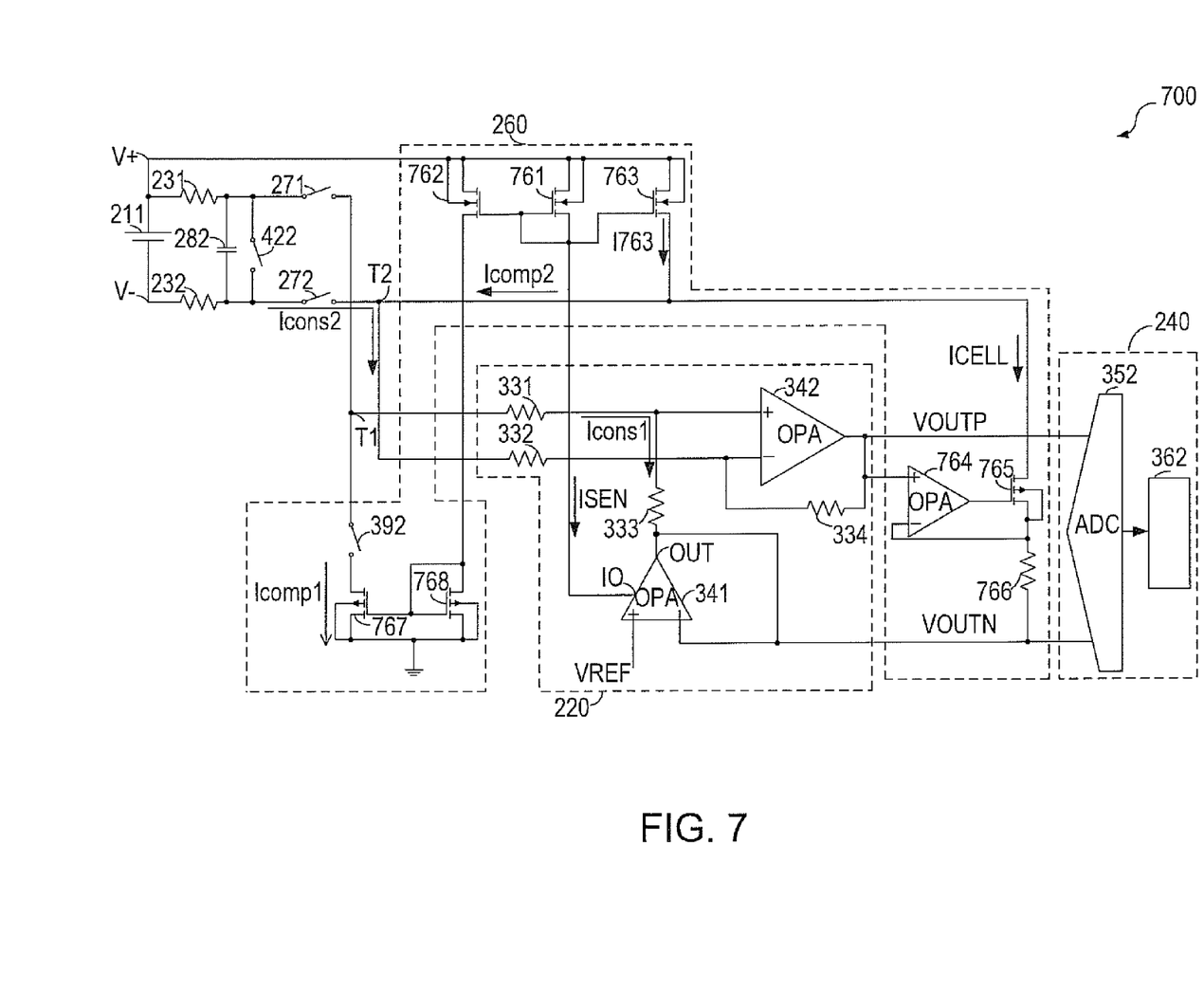
FIG. 7 illustrates an example of a circuit for measuring a cell voltage of a cell in a battery, in accordance with another embodiment of the present invention.

FIG. 7 illustrates an example of a circuit 700 for measuring a cell voltage of a cell in a battery, in accordance with another embodiment of the present invention. FIG. 7 is described in combination with FIG. 8.

Figure 8:
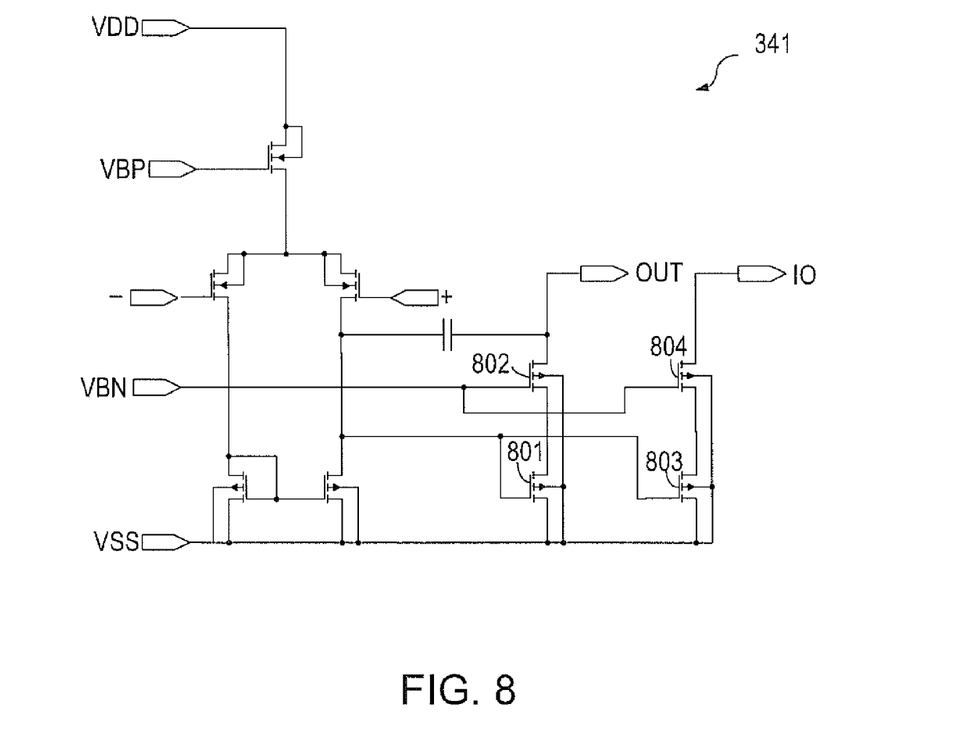
FIG. 8 illustrates an example of an amplifier in FIG. 7, in accordance with one embodiment of the present invention.

In the example of FIG. 7, the amplifier 341 in the level shifter 220 senses the current $I_{cons1}$. FIG. 8 shows an example of the amplifier 341 including metal-oxide-semiconductor field effect transistors (MOSFETs). In the example of FIG. 8, $V_{DD}$ and $V_{SS}$ are supply voltages for the amplifier 341, and $V_{BP}$ and $V_{BN}$ are biased voltages. MOSFETs 801-802 and MOSFETs 803-804 constitute current mirrors. In one embodiment, the current flowing through the terminal IO is proportional to the current flowing through the terminal OUT. The current $I_{cons1}$ in FIG. 7 flows through the resistor 333 into the terminal OUT of the amplifier 341. Accordingly, a sense current $I_{SEN}$ in FIG. 7 flowing into the terminal IO senses the current $I_{cons1}$ and is proportional to the current $I_{cons1}$.

In the example of FIG. 7, the current generator 260 generates the compensation currents $I_{comp1}$ and $I_{comp2}$ according to the sense current $I_{SEN}$. More specifically, the current generator 260 includes a current mirror constituted by MOSFETs 761-763 for sourcing the compensation current $I_{comp2}$, and includes a current mirror constituted by MOSFETs 767-768 for sinking the compensation current $I_{comp1}$. The sense current $I_{SEN}$ flows through the MOSFET 761. Thus, the compensation current $I_{comp1}$ flowing through the MOSFET 767 and the current $I_{763}$ flowing through the MOSFET 763 are proportional to the sense current $I_{SEN}$. In one embodiment, the current $I_{763}$ is substantially equal to the current $I_{cons1}$.

The current generator 260 further includes an amplifier 764, a MOSFET 765 and a resistor 766. In one embodiment, the resistor 766 is identical to the resistor 333 and the resistor 334. By combining the equations (8) and (9), the current $I_{CELL}$ flowing through the MOSFET 765 can be given by:

$$I_{CELL} = (V_{OUTP} - V_{OUTN})/R_{766} = (V_{T1} - V_{T2})/R_{331}, \quad (14)$$

where $R_{766}$ is the resistance of the resistor 766.

The current $I_{cons1}$ is substantially equal to $(V_{T1} - V_{OUTN})/(R_{331} + R_{333})$. The current $I_{cons2}$ is substantially equal to $(V_{T2} - V_{OUTP})/(R_{332} + R_{334})$. The difference between the currents $I_{cons1}$ and $I_{cons2}$ can be given by:

$$\begin{aligned} I_{cons1} - I_{cons2} &= (V_{T1} - V_{OUTN})/(R_{331} + R_{333}) - (V_{T2} - V_{OUTP})/(R_{332} - R_{334}) \\ &= [(V_{T1} - V_{T2}) + (V_{OUTP} - V_{OUTN})]/(R_{331} + R_{333}) = (V_{T1} - V_{T2})/R_{331}. \end{aligned} \quad (15)$$

By combining the equations (14) and (15), the current $I_{cons2}$ can be given by:

$$I_{cons2} = I_{cons1} - I_{CELL}. \quad (16)$$

Therefore, the compensation current $I_{comp2}$, which is equal to $I_{763} - I_{CELL}$ and thus $I_{cons1} - I_{CELL}$, is substantially equal to the current $I_{cons2}$.

Figure 9:
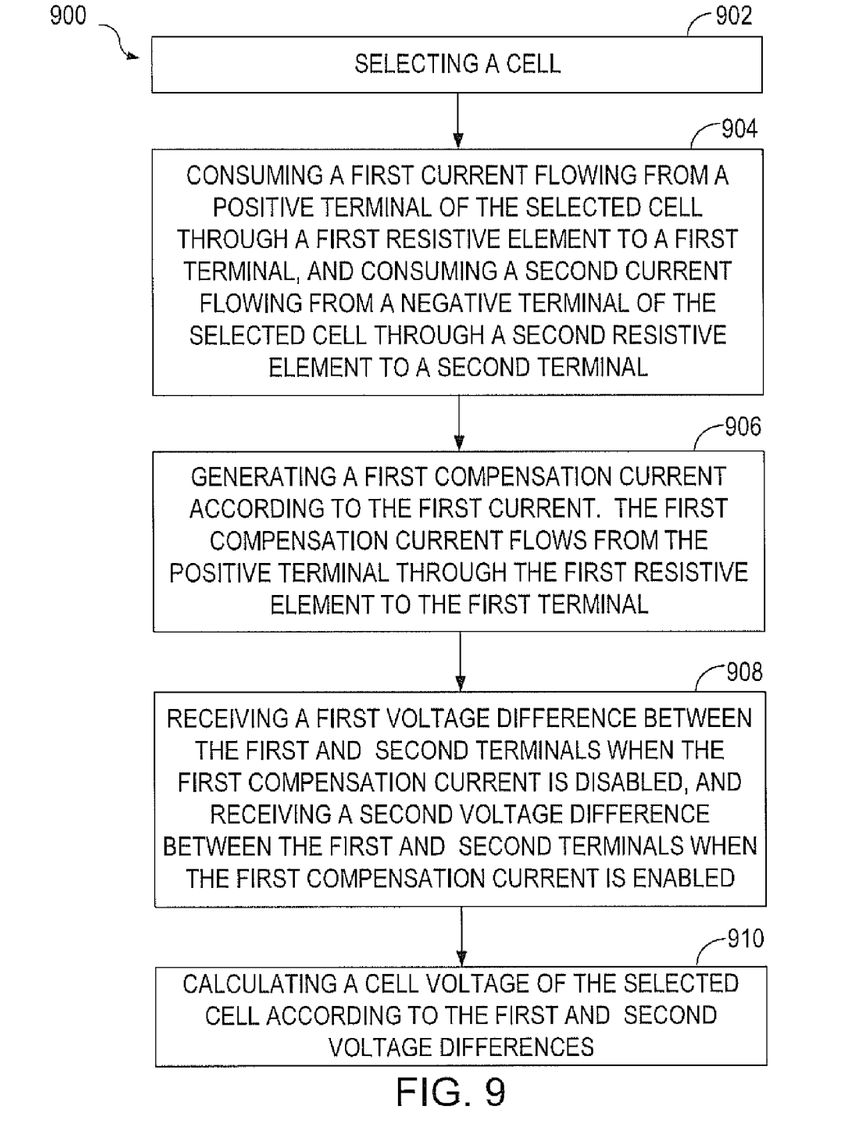
FIG. 9 illustrates an example of a flowchart of a method for measuring a cell voltage of a cell in a battery, in accordance with one embodiment of the present invention.

FIG. 9 illustrates an example of a flowchart of a method 900 for measuring a cell voltage of a cell in a battery, in accordance with one embodiment of the present invention. FIG. 9 is described in combination with FIG. 2-FIG. 8.

In block 902, a cell, e.g., cell 211, is selected. In block 904, a measurement circuit consumes a first current flowing from a positive terminal of the selected cell through a first resistive element to a first terminal, and consumes a second current flowing from a negative terminal of the selected cell through a second resistive element to a second terminal. For example, the measurement circuit consumes a current $I_{cons1}$ flowing from a positive terminal V+ of the cell 211 through a resistor 231 and a switch 271 to a terminal T1, and consumes a current $I_{cons2}$ flowing from a negative terminal V− of the cell 211 through a resistor 232 and a switch 273 to a terminal T2.

In block 906, a first compensation current is generated according to the first current. The first compensation current flows from the positive terminal of the selected cell through the first resistive element to the first terminal. For example, if the cell 211 is selected, a compensation current $I_{comp1}$ is generated according to the current $I_{cons1}$. The compensation current $I_{comp1}$ flows from the positive terminal V+ through the resistor 231 and the switch 271 to the terminal T1. Additionally, a second compensation current is generated according to the second current. The second compensation current flows from the second terminal through the second resistive element to the negative terminal of the selected cell. For example, if the cell 211 is selected, a compensation current $I_{comp2}$ is generated according to the current $I_{cons2}$. The compensation current $I_{comp2}$ flows from the terminal T2 through the switch 273 and the resistor 232 to the negative terminal V−. In one embodiment, the compensation current $I_{comp1}$ is proportional to the current $I_{cons1}$, and the compensation current $I_{comp2}$ is substantially equal to the current $I_{cons2}$.

In block 908, the measurement circuit receives a first voltage difference between the first and second terminals when the first compensation current is disabled, and receives a second voltage difference between the first and second terminals when the first compensation current is enabled. More specifically, a first voltage drop across the first resistive element is generated when the first compensation current is disabled. A second voltage drop across the first resistive element is generated when the first compensation current is enabled. The first voltage difference indicates a first difference between a cell voltage of the selected cell and the first voltage drop. The second voltage difference indicates a second difference between the cell voltage and the second voltage drop. The measurement circuit further provides a first shifted voltage difference indicating the first voltage difference and provides a second shifted voltage difference indicating the second voltage difference.

By way of example, when the compensation current $I_{comp1}$ is disabled, a first voltage drop $V_{DROP1}$ across the resistor 231 is generated. A first voltage difference $V_{DIFF1}$ between the terminals T1 and T2 is received. The first voltage difference $V_{DIFF1}$ indicates a first difference between a cell voltage $V_{CELL}$ of the cell 211 and the first voltage drop $V_{DROP1}$. Accordingly, a first shifted voltage difference $V_{O1}$ between shifted terminal voltages $V_{OUTP}$ and $V_{OUTN}$ is provided. The first shifted voltage difference $V_{O1}$ indicates the first voltage difference $V_{DIFF1}$. When the compensation current $I_{comp1}$ is enabled, a second voltage drop $V_{DROP2}$ across the resistor 231 is generated. A second voltage difference $V_{DIFF2}$ between the terminals T1 and T2 is received. The second voltage difference $V_{DIFF2}$ indicates a second difference between the cell voltage $V_{CELL}$ and the second voltage drop $V_{DROP2}$. Accordingly, a second shifted voltage difference $V_{O2}$ between the shifted terminal voltages $V_{OUTP}$ and $V_{OUTN}$ is provided. The second shifted voltage difference $V_{O2}$ indicates the second voltage difference $V_{DIFF2}$.

In block 910, the measurement circuit calculates the cell voltage according to the first voltage difference and the second voltage difference. More specifically, the measurement circuit calculates a third voltage proportional to the first shifted voltage difference and subtracts the second shifted voltage difference from the third voltage. For example, a third voltage $V_{O3}$ is calculated, which is proportional to the first shifted voltage difference $V_{O1}$. The cell voltage $V_{CELL}$ is obtained by subtracting the second shifted voltage difference $V_{O2}$ from the third voltage $V_{O3}$. In other words, the cell voltage $V_{CELL}$ is calculated according a proportion of the second voltage drop $V_{DROP2}$ to the first voltage drop $V_{DROP1}$ by the measurement circuit.

Figure 10:
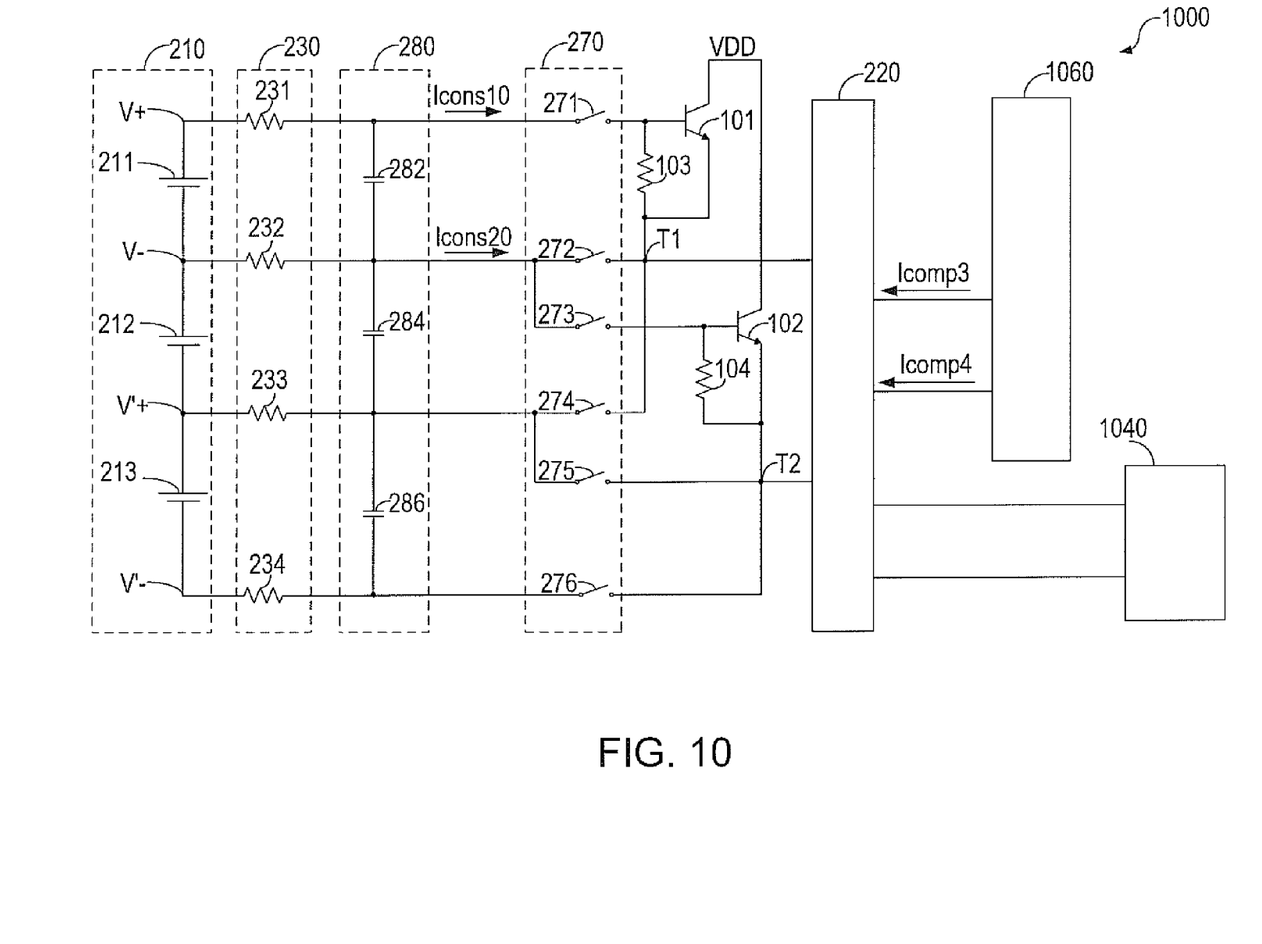
FIG. 10 illustrates an example of a circuit for measuring a cell voltage of a cell in a battery, in accordance with another embodiment of the present invention.

FIG. 10 illustrates an example of a circuit 1000 for measuring a cell voltage of a cell in a battery, in accordance with another embodiment of the present invention. Elements labeled the same as in FIG. 2 have similar functions.

The circuit 1000 includes a battery 210, a resistor group 230, a capacitor group 280, a switch group 270, a level shifter 220, a current generator 1060 and a measurement unit 1040. The circuit 1000 further includes bipolar transistors 101 and 102 for reducing the impact of currents $I_{cons10}$ and $I_{cons20}$ on the cell voltage measurement when the cell 211 is selected. Resistors 103 and 104 are used to generate biased voltages between bases and emitters of the bipolar transistors 101 and 102. More specifically, when the cell 211 is selected, assuming that the currents flowing through the resistors 103 and 104 can be ignored, the currents $I_{cons10}$ and $I_{cons20}$ are the base currents of the bipolar transistors 101 and 102, and the currents flowing into the level shifter 220 are the emitter currents of the bipolar transistors 101 and 102. For a bipolar transistor, the base current is less than the emitter current. Therefore, the currents $I_{cons10}$ and $I_{cons20}$ are less than the currents flowing into the level shifter 220. In one embodiment, the currents $I_{cons10}$ and $I_{cons20}$ can be ignored, and thus the voltage drops across the resistors 231 and 232 can be ignored. The level shifter 220 receives a voltage difference between terminals T1 and T2 and provides a shifted voltage difference proportional to the cell voltage of the selected cell 211. The measurement circuit 1040 measures shifted voltage difference generated by the level shifter 220. Accordingly, the circuit 1000 obtains the cell voltage $V_{CELL}$ for cell 211. The circuit 1000 measures the cell voltages for the cells 212 and 213 in a similar manner as the circuit 200 measures the cell voltages for the cells 212 and 213 in FIG. 2. In other words, like the current generator 260 in FIG. 2, the current generator 1060 generates compensation currents when measuring cell voltages for cells 212 and 213. However, when measuring the cell voltage for cell 211, the current generator 1060 need not generate compensation currents $I_{comp1}$ and $I_{comp2}$ because the currents consumed by the level shifter 220 can be ignored.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A circuit for measuring a cell voltage of a cell in a battery, said circuit comprising:
    a measurement circuit that comprises a first terminal selectively coupled to a positive terminal of said cell via a first resistive element and comprises a second terminal selectively coupled to a negative terminal of said cell via a second resistive element, and that consumes a first current flowing from said positive terminal through said first resistive element to said first terminal while said first terminal is coupled to said positive terminal; and
    a current generator, selectively coupled to said positive terminal of said battery via said first terminal and said first resistive element, that generates a first compensation current according to said first current, wherein said first compensation current flows from said positive terminal through said first resistive element to said first terminal,
    wherein said measurement circuit obtains a first value indicative of a first voltage difference between said first terminal and said second terminal when said first compensation current is disabled, obtains a second value indicative of a second voltage difference between said first terminal and said second terminal when said first compensation current is enabled, calculates a third value proportional to said first value, and calculates said cell voltage by subtracting said second value from said third value.

2. The circuit of claim 1, wherein a first voltage drop is generated across said first resistive element when said first compensation current is disabled, wherein a second voltage drop is generated across said first resistive element when said first compensation current is enabled, and wherein said measurement circuit further calculates said cell voltage according to a proportion of said second voltage drop to said first voltage drop.

3. The circuit of claim 1, wherein said first compensation current is proportional to said first current.

4. The circuit of claim 1, wherein said measurement circuit includes a level shifter that provides a first shifted voltage difference indicative of said first voltage difference if said first compensation current is disabled, and provides a second shifted voltage difference indicative of said second voltage difference if said first compensation current is enabled, and wherein said first value comprises a value of said first shifted voltage difference, and said second value comprises a value of said second shifted voltage difference.

5. The circuit of claim 4, wherein said measurement circuit calculates said cell voltage by calculating a voltage value proportional to said first shifted voltage difference, and subtracting said second shifted voltage difference from said voltage value, and wherein said third value comprises said voltage value.

6. The circuit of claim 4, wherein said level shifter comprises an amplifier that generates a sense current according to said first current and receives a predetermined reference voltage, and wherein said current generator generates said first compensation current according to said sense current.

7. The circuit of claim 1, wherein said measurement circuit further measures a third voltage difference between said first and second terminals to obtain a first result when a switch coupled between said first terminal and said second terminal is turned on and said first compensation current is disabled, and measures a fourth voltage difference between said first and second terminals to obtain a second result when said switch is turned on and said first compensation current is enabled, and wherein said measurement circuit further calculates said cell voltage according to said first and second results.

8. The circuit of claim 1, wherein said measurement circuit consumes a second current flowing from said negative terminal through said second resistive element to said second terminal while said second terminal is coupled to said negative terminal, wherein said current generator further generates a second compensation current according to said second current, and wherein said second compensation current flows from said second terminal through said second resistive element to said negative terminal.

9. The circuit of claim 1, wherein said measurement circuit comprises an analog-to-digital converter for converting signals indicative of said first and second voltage differences into digital signals, and wherein said measurement circuit calculates said cell voltage based on said digital signals.

10. A system comprising:
    a plurality of cells;
    a plurality of resistors coupled to said cells;
    a measurement circuit that comprises a first terminal coupled to a positive terminal of a cell of said cells via a first resistor of said resistors and comprises a second terminal coupled to a negative terminal of said cell via a second resistor of said resistors, and that consumes a first current flowing from said positive terminal through said first resistor to said first terminal; and
    a current generator, coupled to said cells, that generates a first compensation current according to said first current, wherein said first compensation current flows from said positive terminal through said first resistor to said first terminal,
    wherein said measurement circuit obtains a first value indicative of a first voltage difference between said first and second terminals when said first compensation current is disabled, obtains a second value indicative of a second voltage difference between said first and second terminals when said first compensation current is enabled, calculates a third value proportional to said first value, and calculates said cell voltage by subtracting said second value from said third value.

11. The system of claim 10, wherein said first compensation current is proportional to said first current.

12. The system of claim 10, wherein said measurement circuit includes a level shifter that provides a first shifted voltage difference indicative of said first voltage difference if said first compensation current is disabled, and provides a second shifted voltage difference indicative of said second voltage difference if said first compensation current is enabled, and wherein said first value comprises a value of said first shifted voltage difference, and said second value comprises a value of said second shifted voltage difference.

13. The system of claim 12, wherein said measurement circuit calculates said cell voltage by calculating a voltage value proportional to said first shifted voltage difference, and subtracting said second shifted voltage difference from said voltage value, and wherein said third value comprises said voltage value.

14. The system of claim 10, wherein said measurement circuit consumes a second current flowing from said negative terminal through said second resistive element to said second terminal, wherein said current generator further generates a second compensation current according to said second current, and wherein said second compensation current flows from said second terminal through said second resistive element to said negative terminal.

15. A method for measuring a cell voltage of a cell in a battery, said method comprising:
consuming a first current flowing from a positive terminal of said cell through a first resistive element to a first terminal;
consuming a second current flowing from a negative terminal of said cell through a second resistive element to a second terminal;
generating a first compensation current according to said first current, wherein said first compensation current flows from said positive terminal through said first resistive element to said first terminal;
obtaining a first value indicative of a first voltage difference between said first terminal and said second terminal when said first compensation current is disabled;
obtaining a second value indicative of a second voltage difference between said first terminal and said second terminal when said first compensation current is enabled;
calculating a third value proportional to said first value; and
calculating said cell voltage by subtracting said second value from said third value.

16. The method of claim 15, wherein a first voltage drop across said first resistive element is generated when said first compensation current is disabled, and a second voltage drop across said first resistive element is generated when said first compensation current is enabled, wherein said method further comprises calculating said cell voltage according to a proportion of said second voltage drop to said first voltage drop.

17. The method of claim 16, wherein said first voltage difference indicates a first difference between said cell voltage and said first voltage drop, and wherein said second voltage difference indicates a second difference between said cell voltage and said second voltage drop.

18. The method of claim 15, further comprising:
providing a first shifted voltage difference indicating said first voltage difference and a second shifted voltage difference indicating said second voltage difference, wherein said first value comprises a value of said first shifted voltage difference, and said second value comprises a value of said second shifted voltage difference.

19. The method of claim 18, further comprising:
calculating a voltage value proportional to said first shifted voltage difference; and
subtracting said second shifted voltage difference from said voltage value to calculate said cell voltage,
wherein said third value comprises said voltage value.

20. A circuit for measuring a cell voltage of a cell in a battery, said circuit comprising:
a measurement circuit that comprises a first terminal selectively coupled to a positive terminal of said cell via a first resistive element and comprises a second terminal selectively coupled to a negative terminal of said cell via a second resistive element, and that consumes a consumed current flowing from said positive terminal through said first resistive element to said first terminal while said first terminal is coupled to said positive terminal; and
a current generator, selectively coupled to said positive terminal of said battery via said first terminal and said first resistive element, that generates a compensation current according to said consumed current to flow from said positive terminal through said first resistive element to said first terminal,
wherein said measurement circuit obtains a first value indicative of a voltage difference between said first and second terminals when a switch coupled between said first and second terminals is turned off and said compensation current is disabled, obtains a second value indicative of a voltage difference between said first and second terminals when said switch is turned off and said compensation current is enabled, measures a voltage difference between said first and second terminals to obtain a first result when said switch is turned on and said compensation current is disabled, measures a voltage difference between said first and second terminals to obtain a second result when said switch is turned on and said compensation current is enabled, and calculates said cell voltage according to said first and second values and said first and second results.

* * * * *